(12) United States Patent
Kiyohara et al.

(10) Patent No.: US 11,476,078 B2
(45) Date of Patent: Oct. 18, 2022

(54) CHARGED PARTICLE BEAM APPARATUS

(71) Applicant: HITACHI HIGH-TECH SCIENCE CORPORATION, Tokyo (JP)

(72) Inventors: Masahiro Kiyohara, Tokyo (JP); Atsushi Uemoto, Tokyo (JP)

(73) Assignee: HITACHI HIGH-TECH SCIENCE CORPORATION, Tokyo (JP)

( * ) Notice: Subject to any disclaimer, the term of this patent is extended or adjusted under 35 U.S.C. 154(b) by 0 days.

(21) Appl. No.: 17/203,008

(22) Filed: Mar. 16, 2021

(65) Prior Publication Data

US 2021/0296084 A1 Sep. 23, 2021

(30) Foreign Application Priority Data

Mar. 18, 2020 (JP) .............................. JP2020047395

(51) Int. Cl.
*H01J 37/20* (2006.01)
*H01J 37/304* (2006.01)

(52) U.S. Cl.
CPC .......... *H01J 37/20* (2013.01); *H01J 37/3045* (2013.01); *H01J 2237/20214* (2013.01); *H01J 2237/31749* (2013.01)

(58) Field of Classification Search
CPC ................... H01J 37/20; H01J 37/3045; H01J 2237/20214; H01J 2237/31749; H01J 2237/20207; H01J 2237/3174; H01J 37/15; H01J 37/28; H01J 2237/31745
See application file for complete search history.

(56) References Cited

U.S. PATENT DOCUMENTS

| | | | | |
|---|---|---|---|---|
| 6,444,991 | B1* | 9/2002 | Yamada | H01J 37/20 250/442.11 |
| 7,528,393 | B2* | 5/2009 | Akeno | H01L 21/67213 250/398 |
| 8,334,520 | B2* | 12/2012 | Otaka | H01J 37/20 250/442.11 |
| 10,896,801 | B2* | 1/2021 | Inoue | G01N 21/9501 |
| 2002/0089655 | A1* | 7/2002 | Kida | H01L 21/68707 355/72 |
| 2004/0012765 | A1* | 1/2004 | Akutsu | H01J 37/3177 355/53 |
| 2005/0211922 | A1* | 9/2005 | Munekane | H01J 37/31 250/492.21 |

(Continued)

FOREIGN PATENT DOCUMENTS

JP 201672089 A 5/2016

*Primary Examiner* — David A Vanore
(74) *Attorney, Agent, or Firm* — Holland & Hart LLP

(57) ABSTRACT

Provided is a charged particle beam apparatus including a focused ion beam column, a sample holder, a stage supporting the sample holder, a securing member rotating unit, a stage driving unit, and a control device. The sample holder includes a securing member fixing a sample. The securing member rotating unit rotates the securing member around a first rotational axis and a second rotational axis. The stage driving unit translates the stage in three dimensions and rotates the stage around a third rotational axis. The control device acquires a correction value for correcting a change in a position of a center of rotation for rotation around at least one among a first rotational axis, a second rotational axis, and a third rotational axis. The control device translates the stage according to the correction value.

8 Claims, 11 Drawing Sheets

(56) References Cited

U.S. PATENT DOCUMENTS

2008/0013089 A1* 1/2008 Ishii ..................... G03F 9/7011
356/400
2008/0094592 A1* 4/2008 Shibazaki ........... G03F 7/70775
356/509
2017/0299528 A1* 10/2017 Ogata .................. G01N 23/223

* cited by examiner

CHARGED PARTICLE BEAM APPARATUS

CROSS REFERENCE TO RELATED APPLICATION(S)

This application claims the benefit of Japanese Patent Application No. 2020-047395, filed Mar. 18, 2020, which is hereby incorporated by reference in its entirety into this application.

BACKGROUND OF THE INVENTION

1. Technical Field

The present disclosure relates to a charged particle beam apparatus.

2. Description of the Related Art

A charged particle beam apparatus that changes an incidence angle of a charged particle beam by rotating a sample around multiple rotating axes in order to process or observe the sample in three dimensions through irradiation with the charged particle beam, such as a focused ion beam, an electron beam, or the like, is known in the related art (for example, see Patent Document 1).

Document of Related Art (Patent Document 1) Japanese Patent Application Publication No. 2016-72089

SUMMARY OF THE INVENTION

However, in the above-described charged particle beam apparatus, a center of rotation for rotation around each rotating axis may change due to, for example, mechanical precision, intersection, and the like of rotating units on the respective rotating axes. The change of the center of rotation causes a change in an irradiation position of a charged particle beam, so there is a concern that a processing position or an observation position desired at the sample may change.

The present disclosure is directed to providing a charged particle beam apparatus that is capable of limiting a change in an irradiation position of a charged particle beam by properly correcting a positional deviation caused by rotation of a sample.

According to the present disclosure, there is provided a charged particle beam apparatus including: a charged particle beam column irradiating a sample with a charged particle beam; a sample holder having a securing member for fixing the sample; a stage supporting the sample holder; a securing member rotating unit rotating the securing member around a first rotational axis and a second rotational axis parallel to a direction perpendicular to the first rotational axis, independently of the stage; a stage driving unit translating the stage three dimensionally together with the sample holder and rotating the stage together with the sample holder around a third rotational axis; and a processing device correcting an irradiation position of the charged particle beam on the sample by acquiring a correction value for correcting a change in a position of a center of rotation for rotation around at least one among the first rotational axis, the second rotational axis, and the third rotational axis, and translating the stage according to the correction value, thereby correcting an irradiation position of the charged particle beam on the sample.

In the above configuration, with positions of the center of rotation before and after rotation as a pre-rotation position and a post-rotation position, respectively, around at least one among the first rotational axis, the second rotational axis, and the third rotational axis, the correction value may be acquired by synthesizing, a vector of the pre-rotation position and a vector of the post-rotation position with respect to each reference position of rotation of the first rotational axis, the second rotational axis, and the third rotational axis.

In the above configuration, the correction value may be acquired based on the center of rotation changes its position on a predetermined closed curve.

In the above configuration, the closed curve may be an ellipse.

In the above configuration, the charged particle beam apparatus may further include a storage storing table data that shows a corresponding relationship between the correction value and an angle of rotation around each of the first rotational axis, the second rotational axis, and the third rotational axis, wherein the processing device may acquire the correction value from the table data.

In the above configuration, in addition to correction of the irradiation position for rotation around at least one among the first rotational axis, the second rotational axis, and the third rotational axis, the processing device may correct a geometric positional deviation of the sample with respect to an irradiation reference position set relative to the securing member.

In the above configuration, when the rotation around at least one among the first rotational axis, the second rotational axis, and the third rotational axis is performed during irradiation of the sample with the charged particle beam, the processing device corrects the irradiation position after the rotation is performed.

In the above configuration, in addition to the translation and the rotation around the third rotational axis, the stage driving unit may tilt the stage, together with the sample holder, around a tilt axis in an eucentric manner so that the position of a center of rotation is not changed.

According to the present disclosure, a processing device for correcting a change in a position of a center of rotation of a rotating axis for rotation of a sample is provided, thereby limiting a change in an irradiation position of a charged particle beam.

BRIEF DESCRIPTION OF THE DRAWINGS

The above and other objectives, features, and advantages of the present disclosure will be more clearly understood from the following detailed description taken in conjunction with the accompanying drawings, in which.

DESCRIPTION OF THE PREFERRED EMBODIMENTS

Hereinafter, a charged particle beam apparatus according to an embodiment of the present disclosure will be described with reference to the accompanying drawings.

(Charged Particle Beam Apparatus)

Figure 1:
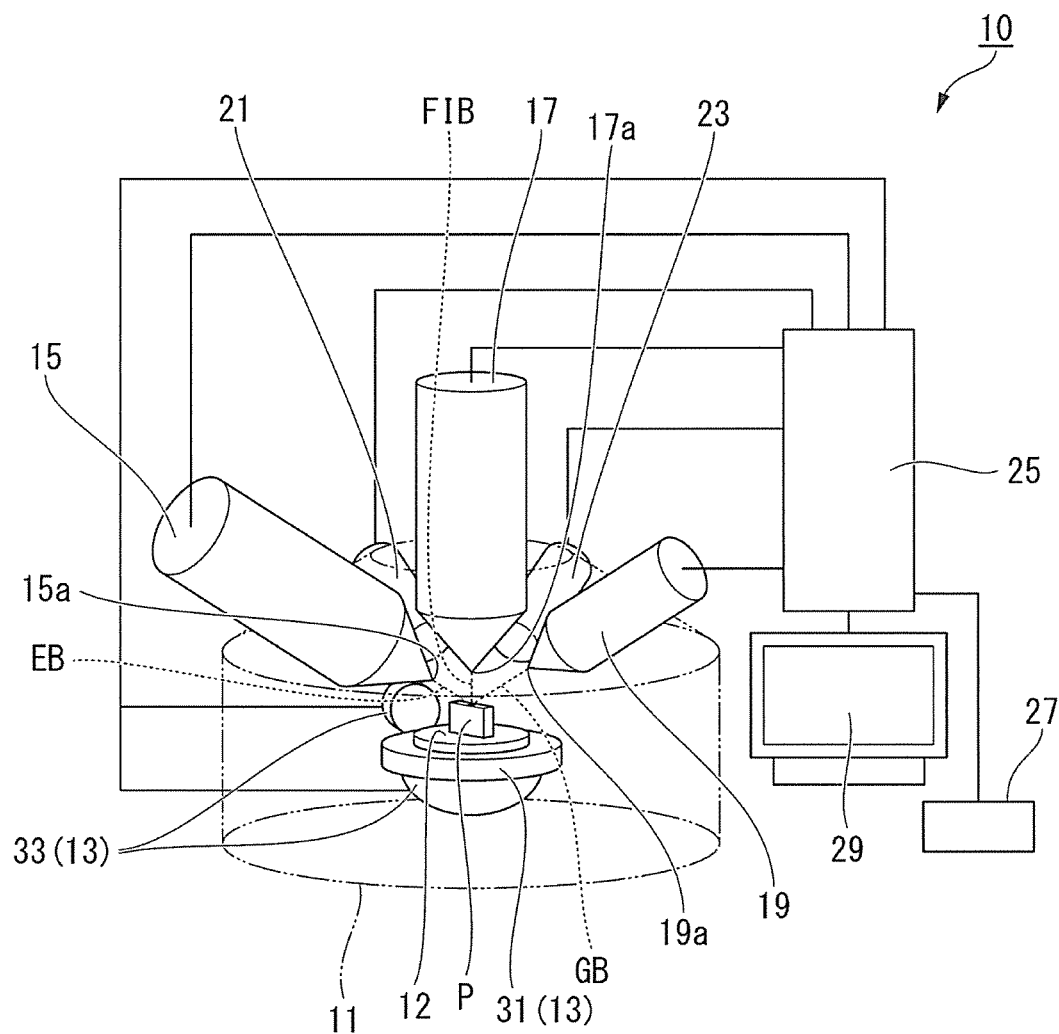
FIG. 1 is a diagram showing a configuration of a charged particle beam apparatus according to an embodiment of the present disclosure.
Figure 2:
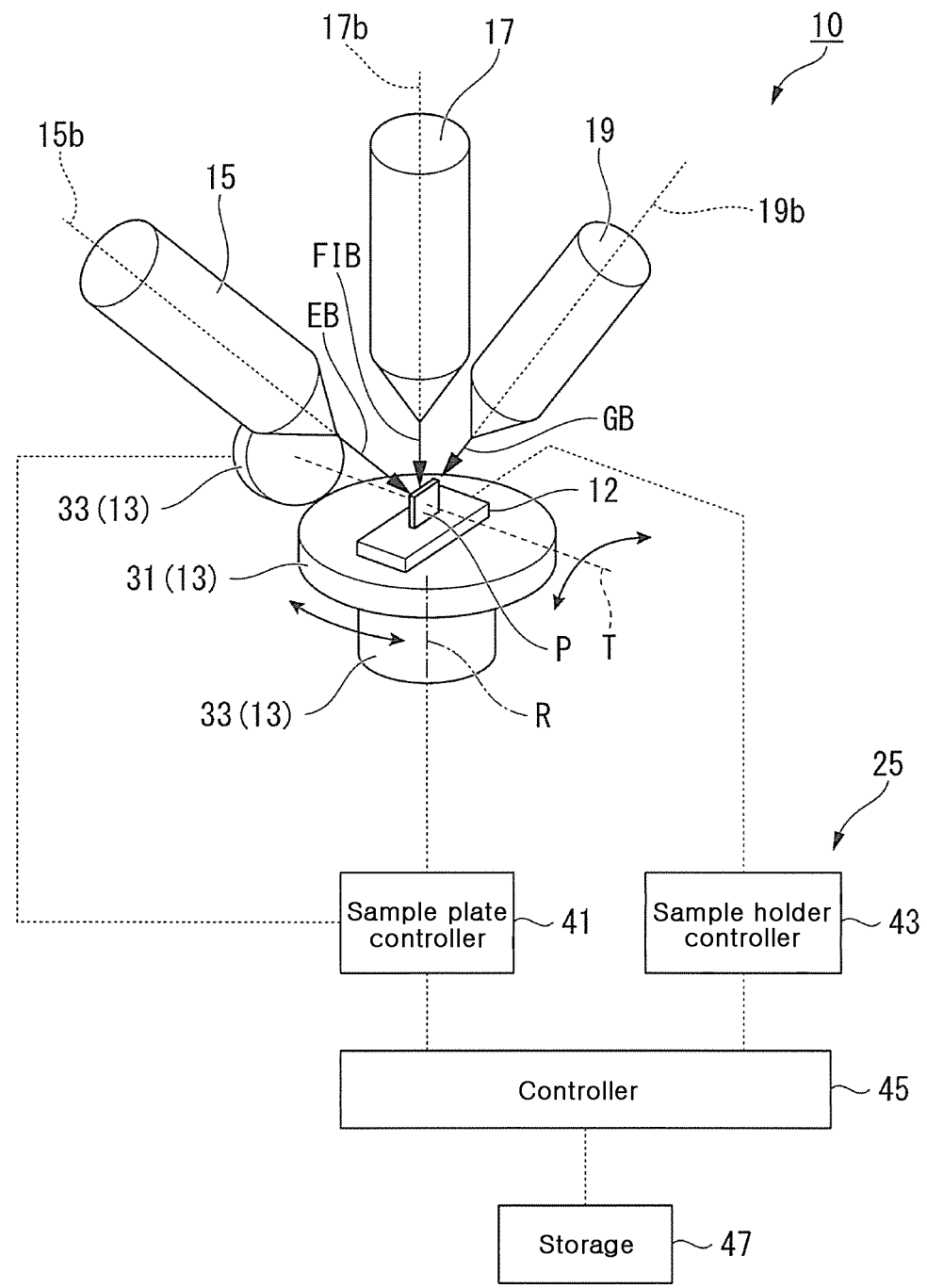
FIG. 2 is a diagram showing a configuration of a control device of a charged particle beam apparatus according to an embodiment of the present disclosure.

FIG. 1 is a diagram showing a configuration of a charged particle beam apparatus 10 according to an embodiment. FIG. 2 is a diagram showing a configuration of a control device 25 of the charged particle beam apparatus 10.

As shown in FIG. 1, the charged particle beam apparatus 10 includes a sample chamber 11, a sample holder 12, a sample plate 13, an electron beam column 15, a focused ion beam column 17, and a gas ion beam column 19, wherein the columns are fixed in the sample chamber 11.

The charged particle beam apparatus 10 includes a secondary charged particle detector 21, for example, as a detector fixed in the sample chamber 11. The charged particle beam apparatus 10 includes a gas supply unit 23 supplying gas to a surface of a sample P. The charged particle beam apparatus 10 includes a control device 25, an input device 27, and a display device 29. Outside the sample chamber 11, the control device 25 controls overall operation of the charged particle beam apparatus 10. The input device 27 and the display device 29 are connected to the control device 25.

In addition, in the following, axis directions of an X-axis, a Y-axis, and a Z-axis perpendicular to each other in a three-dimensional space are parallel to their axes, respectively. For example, the Z-axis direction is parallel to the upward-downward direction (for example, the vertical direction) of the charged particle beam apparatus 10. The X-axis direction and the Y-axis direction are parallel to a reference plane (for example, the horizontal plane) perpendicular to the upward-downward direction of the charged particle beam apparatus 10.

The sample chamber 11 is a pressure-resistant housing having an airtight structure where internal pressure is maintained at a desired reduced state. In the sample chamber 11, exhausting is able to be performed by an exhaust device (not shown) until internal pressure approaches a desired reduced state.

The sample holder 12 fixes the sample P. The sample holder 12 rotates, at an appropriate angle, the sample P around a first rotational axis (F-axis) and a second rotational axis (S-axis) that are predetermined.

The sample holder 12 in an embodiment will be described later.

The sample plate 13 is placed inside the sample chamber 11. The sample plate 13 includes a stage 31 supporting the sample holder 12, and a stage driving unit 33 translating and rotating the stage 31, together with the sample holder 12, in three dimensions.

The stage driving unit 33 includes, for example, three translation units (not shown) translating the stage 31 in the axis directions of the X-axis, the Y-axis, and the Z-axis. As shown in FIG. 2, the stage driving unit 33 includes, for example, two rotating units (not shown) rotating, at an appropriate angle, the stage 31 around a third rotational axis (R-axis) and a tilt axis (T-axis) that are predetermined. The third rotational axis (R-axis) is, for example, set relative to the stage 31, and when the stage 31 is at a predetermined reference position around the tilt axis (T-axis), the third rotational axis (R-axis) is parallel to the upward-downward direction of the charged particle beam apparatus 10. The tilt axis (T-axis) is, for example, parallel to a direction perpendicular to the upward-downward direction of the charged particle beam apparatus 10. The stage driving unit 33 is controlled by a control signal output from the control device 25 depending on an operation mode of the charged particle beam apparatus 10, and the like.

The electron beam column 15 irradiates, with an electron beam EB, an irradiation target within a predetermined irradiation region inside the sample chamber 11. The electron beam column 15 makes, for example, a beam emitting end portion 15a (see FIG. 1) for the electron beam face the stage 31 in a first tilt direction that is tilted at a predetermined angle with respect to the upward-downward direction of the charged particle beam apparatus 10. The electron beam column 15 makes an optical axis 15b of the electron beam parallel to the first tilt direction, and is fixed in the sample chamber 11.

The electron beam column 15 includes an electron source generating electrons, and electron optics focusing and deflecting electrons emitted from the electron source. The electron optics includes, for example, an electron lens, a deflector, and the like. The electron source and the electron optics are controlled by a control signal output from the control device 25 depending on an irradiation position, an irradiation condition of the electron beam, and the like.

The focused ion beam column 17 irradiates, with a focused ion beam FIB, the irradiation target within the predetermined irradiation region inside the sample chamber 11. The focused ion beam column 17 makes, for example, a beam emitting end portion 17a (see FIG. 1) for the focused ion beam face the stage 31 in the upward-downward direction of the charged particle beam apparatus 10. The focused ion beam column 17 makes an optical axis 17b of the focused ion beam parallel to the upward-downward direction, and is fixed in the sample chamber 11.

The focused ion beam column 17 includes an ion source generating ions, and ion optics focusing and deflecting ions drawn out of the ion source. The ion optics includes, for example, a first electrostatic lens, such as a condenser lens, etc., an electrostatic deflector, and a second electrostatic lens, such as an objective lens, etc. The ion source and the ion optics are controlled by a control signal output from the control device 25 depending on an irradiation position, an irradiation condition of the focused ion beam, and the like. The ion source is, for example, a liquid metal ion source using liquid gallium, etc., a plasma ion source, a gas field ion source, or the like.

The gas ion beam column 19 irradiates, with a gas ion beam GB, the irradiation target within the predetermined irradiation region inside the sample chamber 11. The gas ion beam column 19 makes, for example, a beam emitting end portion 19a (see FIG. 1) for the gas ion beam face the stage 31 in a second tilt direction that is different from the tilt direction in which the electron beam column 15 is placed and is tilted at a predetermined angle with respect to the upward-downward direction of the charged particle beam apparatus 10. The gas ion beam column 19 makes an optical axis 19b of the gas ion beam parallel to the second tilt direction, and is fixed in the sample chamber 11.

The gas ion beam column 19 includes an ion source generating gas ions, and ion optics focusing and deflecting gas ions drawn out of the ion source. The ion optics includes, for example, a first electrostatic lens, such as a condenser lens, etc., an electrostatic deflector, and a second electrostatic lens, such as an objective lens, etc. The ion source and the ion optics are controlled by a control signal output from the control device 25 depending on an irradiation position, an irradiation condition of the gas ion beam, and the like. The ion source is, for example, a penning ionization gauge (PIG) ion source, or the like, and generates ions of the noble gases, such as argon (Ar) gas, etc., or ions of other gases, such as oxygen, etc.

The optical axis 15b of the electron beam column 15, the optical axis 17b of the focused ion beam column 17, and the optical axis 19b of the gas ion beam column 19 intersect at a predetermined position above the sample plate 13, for example.

In addition, the arrangement of the electron beam column 15, the focused ion beam column 17, and the gas ion beam column 19 may be appropriately changed. For example, the electron beam column 15 or the gas ion beam column 19 may be placed in the upward-downward direction and the focused ion beam column 17 may be placed in a tilt direction tilted with respect to the upward-downward direction.

The charged particle beam apparatus 10 emits the focused ion beam or the gas ion beam to scan and irradiate the surface of the irradiation target, such that imaging of an irradiated part, various types of processing (excavating, trimming processing, etc.) by sputtering, forming of a deposition film, and the like are able to be performed. The charged particle beam apparatus 10 is capable of performing processing of forming, from the sample P, a sample piece (for example, a lamella sample, a needle-shaped sample, etc.) for transmission-observation using a transmission electron microscope and a sample piece for analysis using the electron beam. The charged particle beam apparatus 10 is capable of performing processing of the sample piece transferred to a sample piece holder into a thin film in a desired thickness that is appropriate for transmission-observation using the transmission electron microscope. The charged particle beam apparatus 10 emits the focused ion beam, the gas ion beam, or the electron beam to scan and irradiate the surface of the irradiation target, such as the sample P, the sample piece, a needle, etc., thereby performing observation of the surface of the irradiation target.

As shown in FIG. 1, the secondary charged particle detector 21 detects secondary charged particles (secondary electrons and secondary ions) generated from the irradiation target due to irradiation with the focused ion beam, the gas ion beam, or the electron beam. The secondary charged particle detector 21 is connected to the control device 25, so that a detection signal output from the secondary charged particle detector 21 is transmitted to the control device 25.

Without being limited to the secondary charged particle detector 21, the charged particle beam apparatus 10 may include other detectors. For example, the detectors include an energy dispersive X-ray spectrometer (EDS) detector, a back-scattered electron detector, an electron back-scattering diffraction (EBSD) detector, and the like. The EDS detector detects X-rays generated from the irradiation target due to irradiation with the electron beam. The back-scattered electron detector detects back-scattered electrons back-scattered from the irradiation target due to irradiation with the electron beam. The EBSD detector detects an electron-beam back-scattering diffraction pattern generated from the irradiation target due to irradiation with the electron beam. In addition, in the secondary charged particle detector 21, the secondary electron detector detecting secondary electrons and the back-scattered electron detector may be provided in a housing of the electron beam column 15.

The gas supply unit 23 is fixed in the sample chamber 11. The gas supply unit 23 includes a gas spray part (nozzle) that is provided facing the stage 31. The gas supply unit 23 supplies etching gas, deposition gas, and the like to the irradiation target. The etching gas stimulates etching of the irradiation target by the focused ion beam or the gas ion beam selectively depending on the material of the irradiation target. The deposition gas forms a deposition film on the surface of the irradiation target by a deposit, such as metal, an insulator, or the like.

The gas supply unit 23 is controlled by a control signal output from the control device 25 depending on the operation mode of the charged particle beam apparatus 10, and the like.

The control device 25 controls overall operation of the charged particle beam apparatus 10 depending on, for example, a signal output from the input device 27 or a signal generated by preset automatic operation control processing. As shown in FIG. 2, the control device 25 includes, for example, a sample plate controller 41 controlling the stage driving unit 33 of the sample plate 13; a sample holder controller 43 controlling a securing member rotating unit 67, which will be described later; a controller 45 controlling the sample plate controller 41 and the securing member rotating unit 67 in an overall manner; and a storage 47.

The control device 25 is, for example, a software functional unit that functions as a predetermined program is executed by a processor, such as a central processing unit (CPU), or the like. The software functional unit is an electronic control unit (ECU) including a processor, such as an CPU, etc., a read only memory (ROM) storing a program, a random access memory (RAM) temporarily storing data, and an electronic circuit, such as a timer, etc. At least a part of the control device 25 may be an integrated circuit, such as large scale integration (LSI), or the like.

As shown in FIG. 1, the input device 27 is, for example, a mouse, a keyboard, and the like that output a signal in consequence of input operation of an operator.

The display device 29 displays various types of information of the charged particle beam apparatus 10, image data generated by a signal output from the secondary charged particle detector 21, and a screen for executing operations, such as zoom-in, zoom-out, shift, rotation, and the like of the image data.

(Sample Holder)

Figure 3:
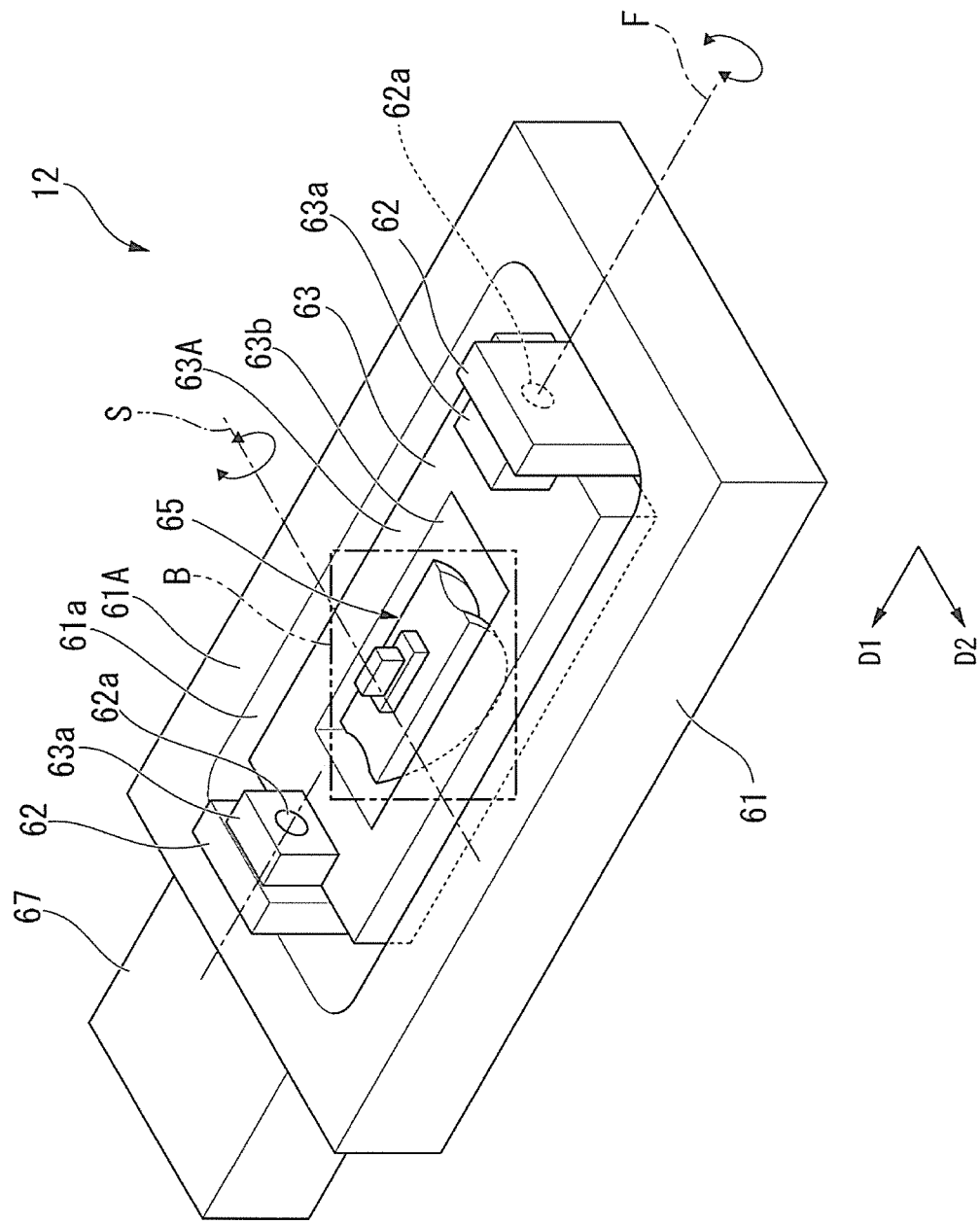
FIG. 3 is a diagram schematically showing a configuration of a sample holder of a charged particle beam apparatus according to an embodiment of the present disclosure.
Figure 4:
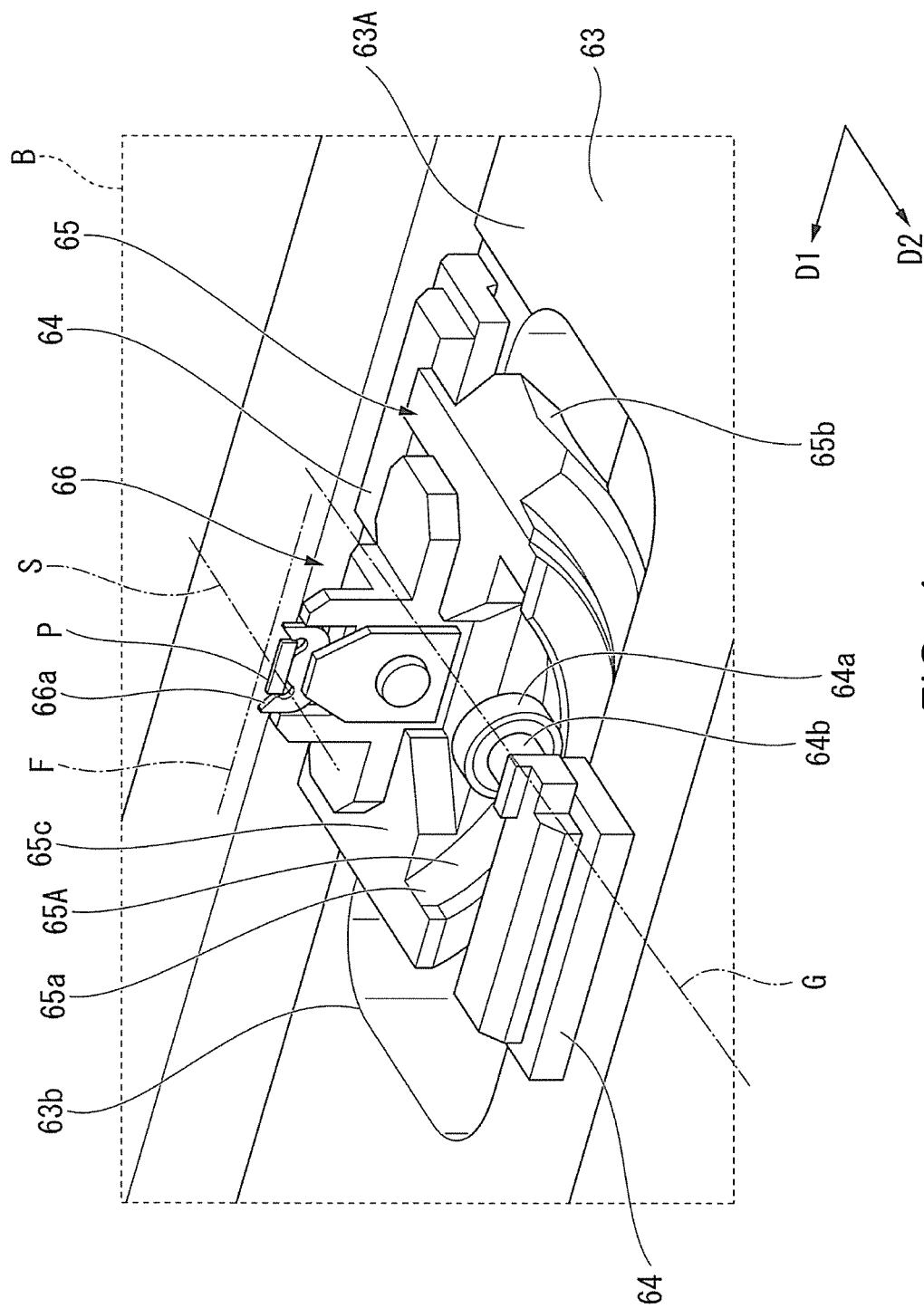
FIG. 4 is a diagram showing a configuration of the sample holder shown in FIG. 3 in detail.

FIG. 3 is a diagram schematically showing a configuration of the sample holder 12 according to an embodiment. FIG. 4 is a diagram showing a configuration of the sample holder 12 in detail and is an enlarged view of region B shown in FIG. 3. The sample holder 12 includes, for example, as shown in FIG. 3, a base plate 61, a pair of first supporting parts 62, a rotating plate 63, a pair of second supporting parts 64 (see FIG. 4), a tilt plate 65, a securing member 66, and a securing member rotating unit 67.

The base plate 61 is supported by the stage 31 of the sample plate 13. The base plate 61 is positioned and fixed on the stage 31 by, for example, a positioning unit (not shown), or the like provided at the stage 31.

The pair of the first supporting parts 62 are fixed at the base plate 61. The pair of the first supporting parts 62 are spaced a predetermined distance apart and placed to face each other in a predetermined first direction D1 set relative to the base plate 61. The first direction D1 is, for example, a length direction of the base plate 61 perpendicular to a thickness direction thereof.

The pair of the first supporting parts 62 includes supporting shafts 62a supporting the rotating plate 63 in a rotatable manner. The center axis line of the supporting shafts 62a is the same as the center axis line of the first rotational axis (F-axis) parallel to the first direction D1. The respective supporting shafts 62a of the pair of the first supporting parts 62 extend protruding in a direction where the supporting shafts 62a face each other in the first direction D1.

The rotating plate 63 is, for example, placed in a concave portion 61a formed in a surface 61A of the base plate 61. The rotating plate 63 includes a pair of bearing parts 63a connected to the supporting shafts 62a of the pair of the first supporting part 62 in a rotatable manner. The rotating plate 63 are supported by the pair of the first supporting parts 62 through the pair of the bearing parts 63a, so that the rotating plate 63 rotates around the first rotational axis (F-axis) at an appropriate angle.

As shown in FIG. 4, the pair of the second supporting parts 64 are fixed at the rotating plate 63. The pair of the second supporting parts 64 are spaced a predetermined distance apart and placed to face each other in a predetermined second direction D2 set relative to the base plate 61. The second direction D2 is, for example, parallel to a direction perpendicular to the first direction D1, and is a width direction of the base plate 61 perpendicular to the thickness direction thereof.

Each of the pair of the second supporting parts 64 includes a roller 64a and a roller shaft 64b that support the tilt plate 65 in a rotatable manner. The center axis line of the roller 64a and the roller shaft 64b is the same as an axis line G parallel to the second direction D2.

The roller 64a is, for example, connected to a front end portion of the roller shaft 64b in a rotatable manner through a bearing, or the like. The respective roller shafts 64b of the pair of the second supporting parts 64 extend protruding in a direction where the roller shafts 64b face each other in the second direction D2.

The tilt plate 65 is, for example, placed in a concave portion 63b formed in a surface 63A of the rotating plate 63. An outward shape of the tilt plate 65 is, for example, a post shape having opposite sections in a semicircular shape that is acquired by cutting a part of a cylindrical body by a cutting plane parallel to the central axis. The axis line of the tilt plate 65 is parallel to the second direction D2.

Opposite end portions of the tilt plate 65 in the axis line direction parallel to the second direction D2 is provided with guide parts 65a on which the respective rollers 64a of the pair of the second supporting parts 64 are placed. An outward shape of each of the guide part 65a is, for example, a concave groove shape having a wall surface that curves with a constant radius of curvature, or the like. Each of the guide part 65a includes a guide surface 65A that curves with a constant radius of curvature around the second rotational axis (S-axis) and is in contact with an outer circumferential surface of the roller 64a. The tilt plate 65 rotates around the second rotational axis (S-axis) at an appropriate angle because the guide surface 65A guides rotation of the roller 64a without slipping.

An outer circumferential part of the tilt plate 65 that curves around the second rotational axis (S-axis) is provided with, for example, a worm wheel part 65b between the opposite end portions in the axis line direction. The center of the pitch circle of the worm wheel part 65b and the center of curvature of the guide surface 65A are positioned on the axis line of the second rotational axis (S-axis). For example, a rotational driving force around the second rotational axis (S-axis) is applied to the tilt plate 65 through a worm (not shown) engaged with the worm wheel part 65b.

The tilt plate 65 includes a plane part 65c connected to the outer circumferential part between the opposite end portions in the axis line direction.

The securing member 66 fixes the sample P. The securing member 66 is fixed at the plane part 65c of the tilt plate 65. The securing member 66 includes, for example, a grid 66a on which the sample P is placed.

As shown in FIG. 3, the securing member rotating unit 67 includes, for example, two rotating units (not shown) rotating, at an appropriate angle, the securing member 66 around the first rotational axis (F-axis) and the second rotational axis S-axis). The securing member rotating unit 67 is controlled by a control signal output from the control device 25 depending on the operation mode of the charged particle beam apparatus 10, and the like.

Hereinafter, operation of the charged particle beam apparatus 10 will be described.

Figure 5:
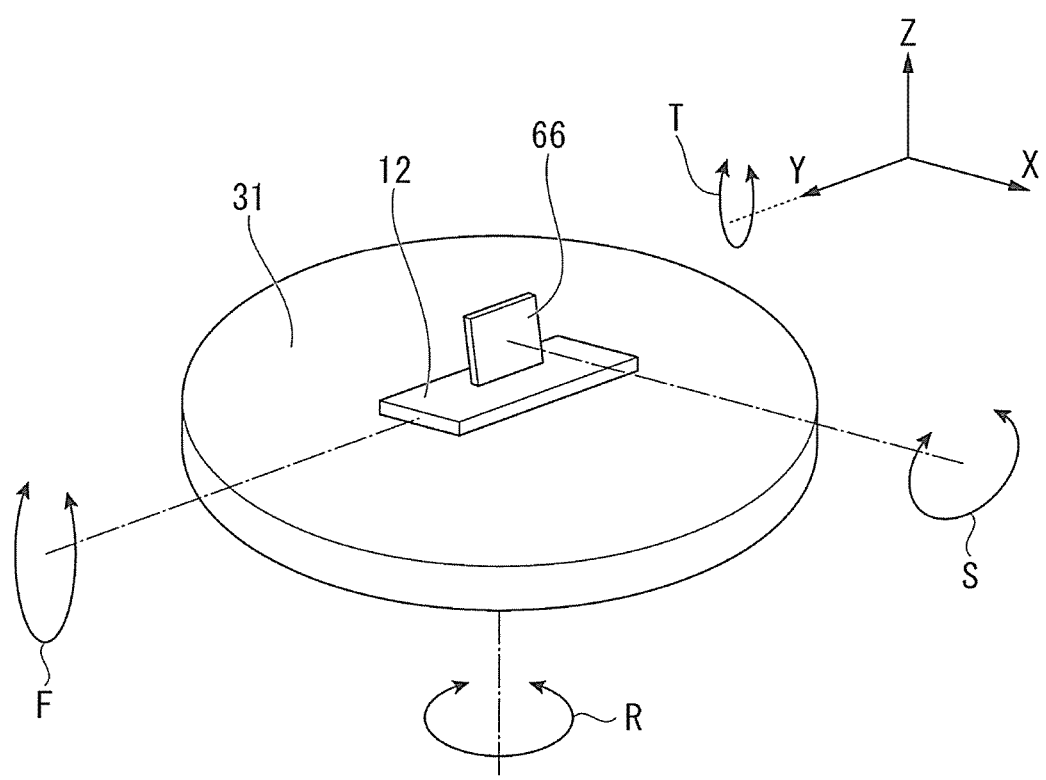
FIG. 5 is a diagram schematically showing rotation of a stage and a securing member of a charged particle beam apparatus according to an embodiment of the present disclosure.

FIG. 5 is a diagram schematically showing rotation of the stage 31 of the sample plate 13 of the charged particle beam apparatus 10 and rotation of the securing member 66 of the sample holder 12.

For example, in a case of an ideal position-aligned state where mechanical precision, intersection, etc. are negligible, the stage driving unit 33 rotates the stage 31 around the third rotational axis (R-axis) and the tilt axis (T-axis) in an eucentric manner so that the position of the center of rotation is not changed, and the securing member rotating unit 67 rotates the securing member 66 around the first rotational axis (F-axis) and the second rotational axis (S-axis) in an eucentric manner so that the position of the center of rotation is not changed. The stage driving unit 33 translates the stage 31 in the axis directions of the X-axis, the Y-axis, and the Z-axis, for example.

The control device 25 performs, for the respective rotation operations of the stage driving unit 33 and the securing member rotating unit 67, processing of correcting a geometric positional deviation of the sample P and processing of correcting a change in a position of a center of rotation.

The geometric positional deviation of the sample P is, for example, a geometric positional deviation of a desired irradiation position and an eucentric position for the sample P caused by the position of the sample P placed on the securing member 66, the shape of the sample P, and the like.

The change in the position of the center of rotation is, for example, a change in the position of the center of rotation of the rotating axis and the tilt axis caused by mechanical precision, intersection, etc.

The control device 25 stores table data for correcting a change in the position of the center of rotation in the storage 47 in advance, for example. The table data is, for example, data showing a corresponding relationship between a correction value and an angle of rotation around the first rotational axis (F-axis), the second rotational axis (S-axis), and the third rotational axis (R-axis). The correction value is, for example, a spatial vector quantity related to a discrepancy of a center of rotation from a reference position of rotation that is a predetermined reference set for the center of rotation of each rotating axis. The reference position of rotation is, for example, a position of a center of rotation when an angle of rotation around each rotating axis is a predetermined value (for example, zero, etc.). The discrepancy of the center of rotation caused by rotation around each axis is not affected by rotation around other axes. For example, when rotation around at least one among the first rotational axis (F-axis), the second rotational axis (S-axis), and the third rotational axis (R-axis) is performed, the control device 25 acquires a correction value by referring to the table data on the basis of information on an angle of rotation around each rotating axis. When rotations around multiple axes are performed, correction values of the respective rotating axes are added to acquire a final correction value. For example, the control device 25 makes the stage driving unit 33 translate the stage 31 in three dimensions so as to offset the change in the position of the center of rotation on the basis of the acquired correction value, thereby correcting the irradiation position of the charged particle beam for the sample P.

Figure 6:
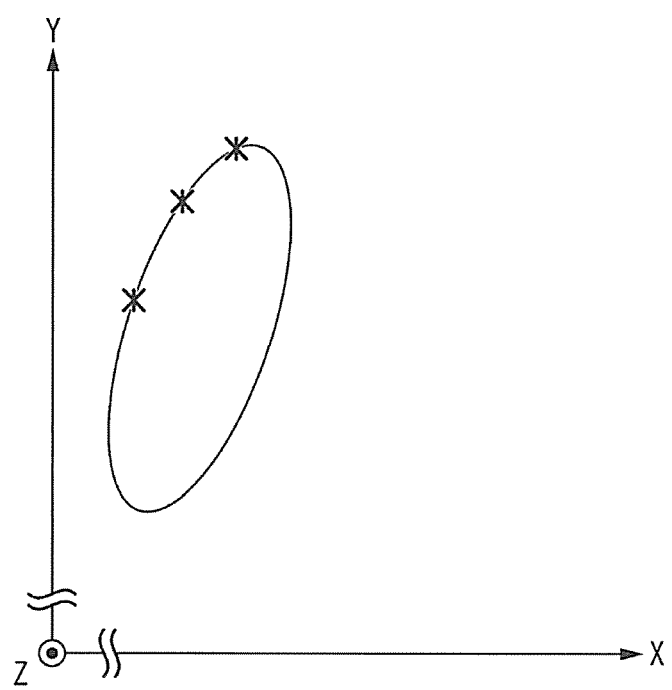
FIG. 6 is a diagram showing, on an X-Y plane, an example of a change in a center of rotation for rotation of a securing member of a sample holder around an S-axis according to an embodiment of the present disclosure.
Figure 7:
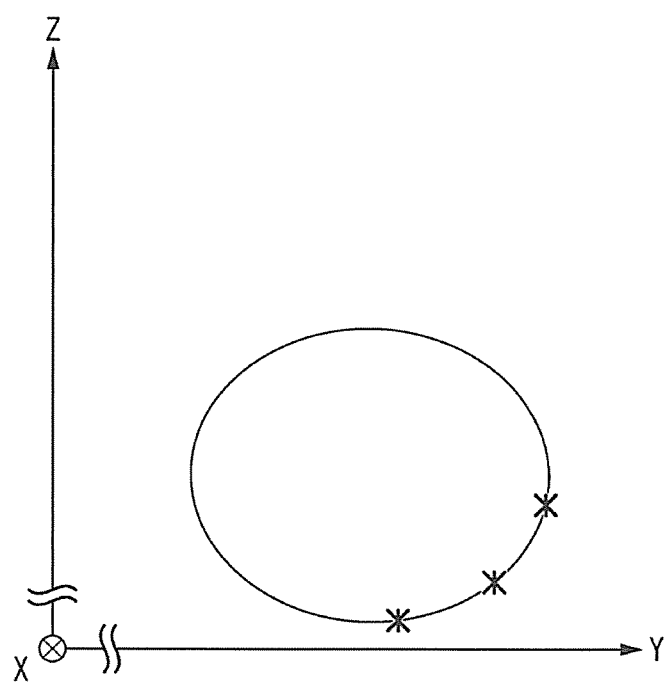
FIG. 7 is a diagram showing, on a Y-Z plane, an example of a change in a center of rotation for rotation of a securing member of a sample holder around an S-axis according to an embodiment of the present disclosure.
Figure 8:
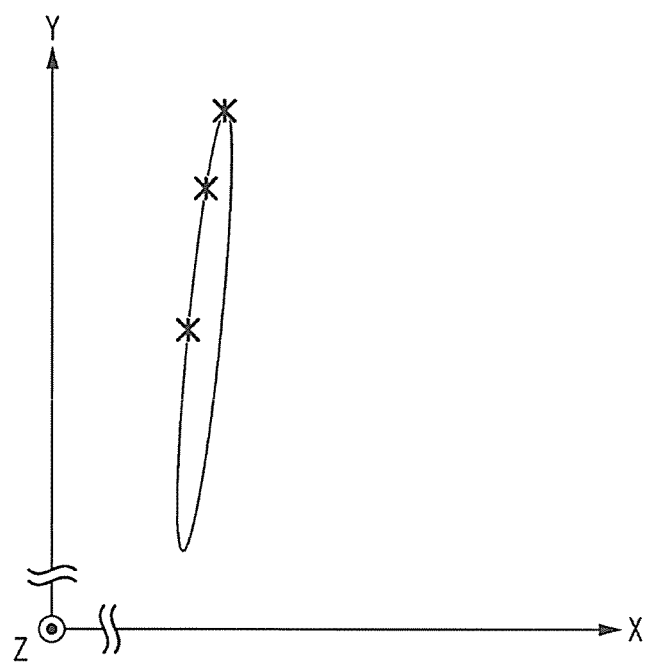
FIG. 8 is a diagram showing, on an X-Y plane, an example of a change in a center of rotation for rotation of a securing member of a sample holder around an F-axis according to an embodiment of the present disclosure.
Figure 9:
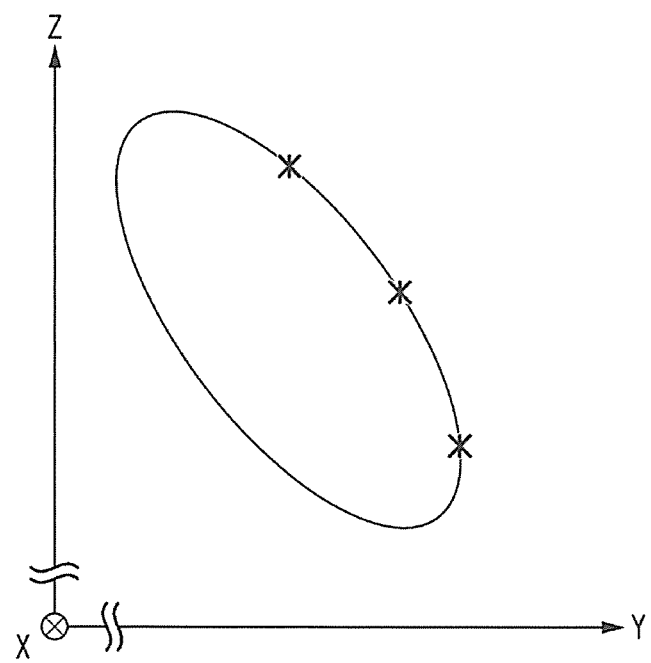
FIG. 9 is a diagram showing, on a Y-Z plane, an example of a change in a center of rotation for rotation of a securing member of a sample holder around an F-axis according to an embodiment of the present disclosure.

FIG. 6 is a diagram showing, on an X-Y plane, an example of a change in the center of rotation for rotation of the securing member 66 of the sample holder 12 around the S-axis. FIG. 7 is a diagram showing, on a Y-Z plane, an example of a change in the center of rotation for rotation of the securing member 66 of the sample holder 12 around the S-axis. FIG. 8 is a diagram showing, on an X-Y plane, an example of a change in the center of rotation for rotation of the securing member 66 of the sample holder 12 around the F-axis. FIG. 9 is a diagram showing, on a Y-Z plane, an example of a change in the center of rotation for rotation of the securing member 66 of the sample holder 12 around the F-axis.

The correction value of the table data is acquired, for example, based on the center of rotation of each rotating axis changing its position on a predetermined closed curve in a three-dimensional space. The predetermined closed curve is an ellipse, for example. The predetermined closed curve is generated on the basis of, for example, multiple measurement points (for example, at least three measurement points, etc.) acquired through measurement of a change in a position of a center of rotation performed with respect to the charged particle beam apparatus 10 in advance.

For example, the control device 25 sets, as a pre-rotation position and a post-rotation position, a position of a center of rotation of each rotating axis before and after rotation around at least one among the first rotational axis (F-axis), the second rotational axis (S-axis), and the third rotational axis (R-axis). The control device 25 acquires a correction value from the table data on the basis of a rotation angle of each rotating axis before and after rotation. The control device 25 acquires a vector of a pre-rotation position (the amount of offset before movement) with respect to the reference position of rotation from a correction value corresponding to the rotation angle of each rotating axis before rotation, and acquires a vector of a post-rotation position (the amount of offset after movement) with respect to the reference position of rotation from a correction value corresponding to the rotation angle of each rotating axis after rotation. The control device 25 operates the stage driving unit 33 by using, as a new correction value, a composite vector acquired by adding the vector of the pre-rotation position and the vector of the post-rotation position, thereby correcting the change in the position of the center of rotation.

For example, when the center of rotation before rotation does not coincide with the reference position of rotation, that is, when an angle of rotation around each rotating axis before rotation is not a predetermined value (for example, zero, etc.), correction by a correction value corresponding to the rotation angle before rotation is reset and new correction by a correction value corresponding to the rotation angle after rotation is performed.

For example, when the center of rotation before rotation coincides with the reference position of rotation, that is, when the angle of ration around each rotating axis before rotation is the predetermined value (for example, zero, etc.), the vector of the pre-rotation position in the above-described composite vector is zero. In this case, resetting of the correction by the correction value corresponding to the rotation angle before rotation is unnecessary, so only correction by the correction value corresponding to the rotation angle after rotation is performed.

Figure 10:
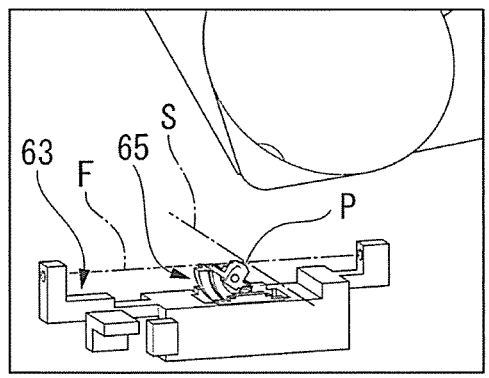
FIG. 10 is a diagram showing examples before and after rotations around a first rotational axis (F-axis), a second rotational axis (S-axis), and a third rotational axis (R-axis) according to an embodiment of the present disclosure.
Figure 10:
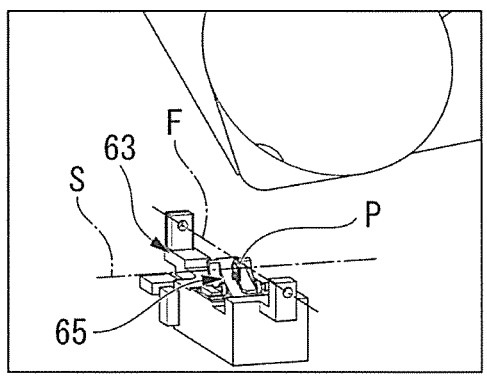
Figure 10:
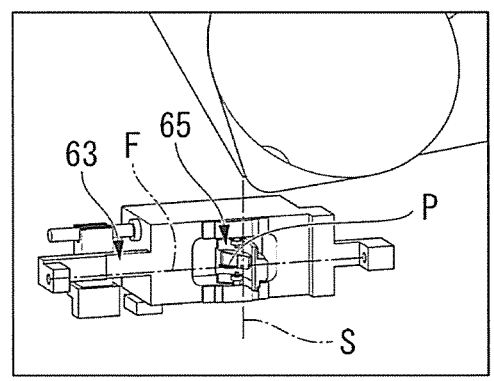

FIG. 10 is a diagram showing examples before and after rotations around the first rotational axis (F-axis), the second rotational axis (S-axis), and the third rotational axis (R-axis).

For example, when transition is performed from a first state where rotation angles of the first rotational axis (F-axis), the second rotational axis (S-axis), and the third rotational axis (R-axis) are 0°, −30°, and 90°, respectively, to a second state where rotations angles are 0°, 30°, and 180°, as the rotation angles of the second rotational axis (S-axis) and the third rotational axis (R-axis) change, a direction (correction direction) in which correction of the center of rotation is performed changes. For example, in the case of correction for the center of rotation of the second rotational axis (S-axis), the correction directions in the first state are the Z-axis direction and the X-axis direction, but the correction directions in the second state are the Z-axis direction and the Y-axis direction. As described above, when the correction directions change before and after rotation, a correction amount after movement is acquired by adding a first correction amount for making a change from the first state to the reference position of rotation and a second correction amount for making a change from the reference position of rotation to the second state. For example, first, the first correction amount for making the rotation angle of the second rotational axis (S-axis) zero from the first state is acquired. Next, after rotation around the third rotational axis (R-axis) is applied, the second correction amount for making the rotation angle of the second rotational axis (S-axis) the second state from zero is acquired. The correction amount acquired through the composition of the first correction amount and the second correction amount is a correction amount after transition from the first state to the second state.

For example, when transition is performed from the first state where the rotation angles of the first rotational axis (F-axis), the second rotational axis (S-axis), and the third rotational axis (R-axis) are 0°, −30°, and 90°, respectively, to a third state where rotation angles are −90°, 30°, and 90°, as the rotations angles of the first rotational axis (F-axis) and the second rotational axis (S-axis) change, a direction (correction direction) in which correction of the center of rotation is performed changes. For example, in the case of correction for the center of rotation of the second rotational axis (S-axis), the correction directions in the first state are the Z-axis direction and the X-axis direction, but the correction directions in the third state are the X-axis direction and the Y-axis direction. As described above, when the correction directions change before and after rotation, a correction amount after movement is acquired by adding a first correction amount for making a change from the first state to the reference position of rotation and a third correction amount for making a change from the reference position of rotation to the third state. For example, first, the first correction amount for making the rotation angle of the second rotational axis (S-axis) zero from the first state is acquired. Next, after rotation around the first rotational axis (F-axis) is applied, the third correction amount for making the rotation angle of the second rotational axis (S-axis) the third state from zero is acquired. The correction amount acquired through the composition of the first correction amount and the third correction amount is a correction amount after transition from the first state to the third state.

Figure 11:
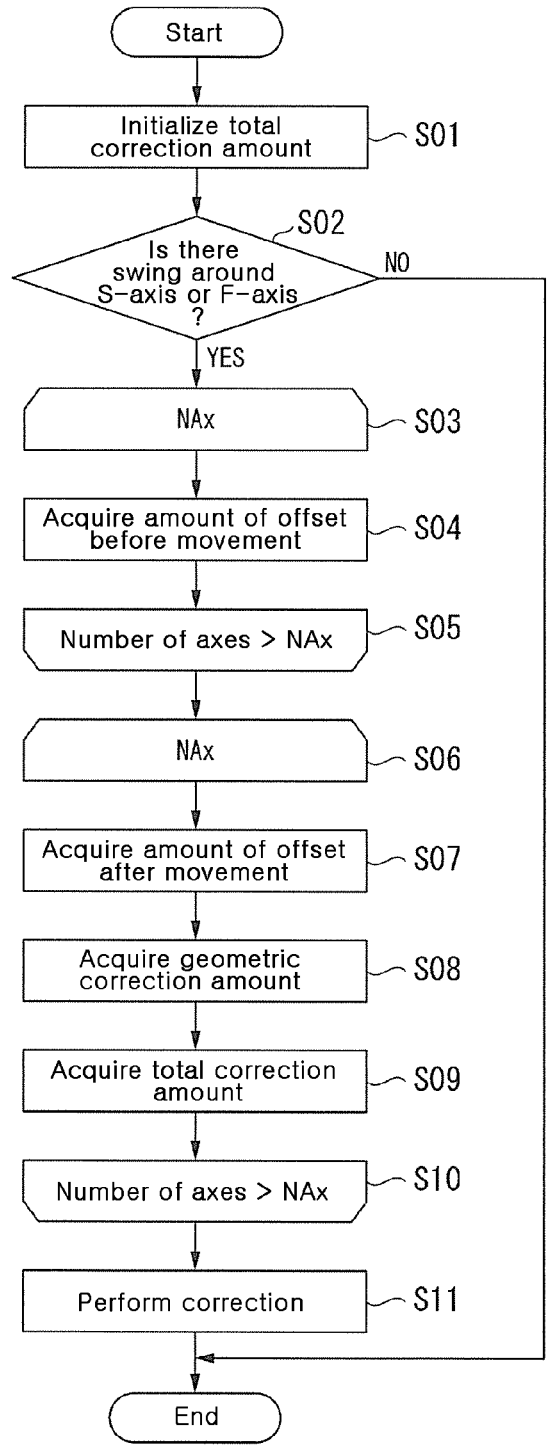
FIG. 11 is a flowchart showing an example of operation of a charged particle beam apparatus according to an embodiment of the present disclosure.

FIG. 11 is a flowchart showing, as an example of operation of the charged particle beam apparatus 10, processing of correcting the change in the position of the center of rotation for rotation around at least one among the first rotational axis (F-axis) and the second rotational axis (S-axis). In addition, processing of correcting the change in the position of the center of rotation for rotation around at least one among the first rotational axis (F-axis), the second rotational axis (S-axis), and the third rotational axis (R-axis) is similar to that described above.

First, the control device 25 initializes a total correction amount to zero at step S01. The total correction amount is the sum of a correction amount for correcting a geometric positional deviation of the sample P and a correction amount (the above-described composite vector) for correcting the change in the position of the center of rotation.

Next, the control device 25 determines whether there is a rotation (swing) around the first rotational axis (F-axis) or the second rotational axis (S-axis), at step S02.

When a result of the determination is "NO" (step S02: NO), the control device 25 ends the processing.

However, when the result of the determination is "YES" (step S02: YES), the control device 25 makes the processing proceed to step S03.

Next, through loop processing of a series of steps S03 to S05, the control device 25 acquires the amount of offset before movement for each of the axes: the first rotational axis (F-axis), the second rotational axis (S-axis), and the third rotational axis (R-axis).

For example, first, the control device 25 sets a value acquired by adding 1 to a current value of a parameter NAx of the number of axes of which an initial value is zero, as a new parameter NAx of the number of axes at step S03.

Next, the control device 25 acquires the amount of offset before movement for any one among the first rotational axis (F-axis), the second rotational axis (S-axis), and the third rotational axis (R-axis) which corresponds to the parameter NAx of the number of axes, at step S04.

Next, the control device 25 determines whether the parameter NAx of the number of axes is smaller than a predetermined number of axes (for example, 4), at step S05.

When a result of the determination is "YES" (step S05: YES), the control device 25 makes the processing proceed back to step S03.

However, when the result of the determination is "NO" (step S05: NO), the control device 25 initializes the parameter NAx of the number of axes and makes the processing proceed to step S06.

Next, through loop processing of a series of steps S06 to S10, the control device 25 acquires a total correction amount for each of the axes: the first rotational axis (F-axis), the second rotational axis (S-axis), and the third rotational axis (R-axis).

For example, first, the control device 25 sets a value acquired by adding 1 to a current value of a parameter NAx of the number of axes of which an initial value is zero, as a new parameter NAx of the number of axes at step S06.

Next, the control device 25 acquires the amount of offset after movement for any one among the first rotational axis (F-axis), the second rotational axis (S-axis), and the third rotational axis (R-axis) which corresponds to the parameter NAx of the number of axes, at step S07.

Next, the control device 25 acquires the correction amount (geometric correction amount) for correcting a geometric positional deviation of the sample P for any one among the first rotational axis (F-axis), the second rotational axis (S-axis), and the third rotational axis (R-axis) which corresponds to the parameter NAx of the number of axes, at step S08.

Next, for any one among the first rotational axis (F-axis), the second rotational axis (S-axis), and the third rotational axis (R-axis) which corresponds to the parameter NAx of the number of axes, the control device 25 acquires a total correction amount from the sum of the geometric correction amount and the composite vector that is acquired by vector composition of the amount of offset before movement and the amount of offset after movement, at step S09.

Next, the control device 25 determines whether the parameter NAx of the number of axes is smaller than a predetermined number of axes (for example, 4), at step S10.

When a result of the determination is "YES" (step S10: YES), the control device 25 makes the processing proceed back to step S06.

However, when the result of the determination is "NO" (step S10: NO), the control device 25 makes the processing proceed to step S11.

Next, the control device 25 operates the stage driving unit 33 by using the total correction amount of each rotating axis, so that the geometric positional deviation of the sample P is corrected and the change in the position of the center of rotation is corrected at step S11. Then, the control device 25 ends the processing.

As described above, the charged particle beam apparatus 10 of the embodiment includes the control device 25 that acquires a correction value for correcting the change in the position of the center of rotation for rotation around at least one among the first rotational axis (F-axis), the second rotational axis (S-axis), and the third rotational axis (R-axis). Accordingly, the positional deviation caused by rotation of the sample P is properly corrected so that the change in the irradiation position of the charged particle beam is limited. For example, even when the sample P is rotated around each rotating axis during finish processing of the sample P, or the like, an eucentric state is maintained so that desired processing is performed with precision.

The control device 25 operates the stage driving unit 33 by using the composite vector acquired by adding the vector of the pre-rotation position and the vector of the post-rotation position before and after rotation, thereby correcting the change in the position of the center of rotation. Accordingly, proper correction with precision is performed, compared to the case, for example, where only the correction value corresponding to the rotation angle is used while the center of rotation before rotation does not coincide with the reference position of rotation, in other words, where only the amount of offset after movement is used not considering the amount of offset before movement, which results in incapability of properly correcting the change in the position of the center of rotation.

Referring to that the center of rotation changes its position on the predetermined closed curve (for example, an ellipse, or the like), the control device 25 acquires the correction value, so that the change in the position of the center of rotation caused by mechanical precision, intersection, etc. of the rotating units of the respective rotating axes is corrected with precision.

The control device 25 acquires the correction value from the table data generated in advance, so that the change in the position of the center of rotation is quickly and easily corrected.

In addition to correction of the change in the position of the center of rotation, the control device 25 corrects the geometric positional deviation of the sample P, so that the irradiation position of the charged particle beam for the sample P is corrected with precision.

(Modification)

Hereinafter, a modification to the embodiment will be described.

In the above-described embodiment, it is described that when the center of rotation before rotation does not coincide with the reference position of rotation, the control device 25 generates a composite vector by using a correction value acquired from the table data on the basis of a rotation angle of each rotating axis before and after rotation, but no limitation thereto is imposed.

For example, referring to a table data of a composite vector generated in advance, the control device 25 may acquire data of the composite vector as a correction value for the change in the position of the center of rotation.

In addition, in the above-described embodiment, when rotation around each rotating axis is performing during irradiation of the sample P with the charged particle beam, the control device 25 corrects the irradiation position after rotation is performed or while rotation is performed.

In the above-described embodiment, the charged particle beam apparatus 10 includes the electron beam column 15, the focused ion beam column 17, and the gas ion beam column 19, but no limitation thereto is imposed.

For example, the charged particle beam apparatus 10 may include at least one among the electron beam column 15, the focused ion beam column 17, and the gas ion beam column 19.

The embodiments of the present disclosure are provided as examples and are not intended to limit the scope of the present disclosure. These embodiments may be implemented in other forms, and various omissions, substitutions, and modifications may be made without departing from the gist of the present disclosure. These embodiments and their modifications are included in the scope or gist of the present disclosure, as well as being included in the disclosure described in the claims and an equivalent scope thereof.

What is claimed is:

1. A charged particle beam apparatus comprising:
    a charged particle beam column irradiating a sample with a charged particle beam;
    a sample holder having a securing member for fixing the sample;
    a stage supporting the sample holder; and
    a processing device correcting an irradiation position of the charged particle beam on the sample, wherein
        the securing member is configured to be rotatable around a first rotational axis and a second rotational axis parallel to a direction perpendicular to the first rotational axis, independently of the stage,
        the stage is configured to be translatable three dimensionally together with the sample holder and rotatable together with the sample holder around a third rotational axis, and
        the processing device corrects the irradiation position of the charged particle beam on the sample by acquiring a correction value for correcting a change in a position of a center of rotation for rotation around at least one among the first rotational axis, the second rotational axis, and the third rotational axis, and translating the stage according to the correction value.

2. The charged particle beam apparatus of claim 1, wherein, with positions of the center of rotation before and after rotation as a pre-rotation position and a post-rotation position, respectively, around at least one among the first rotational axis, the second rotational axis, and the third rotational axis, the correction value is acquired by synthesizing, a vector of the pre-rotation position and a vector of the post-rotation position with respect to each reference position of rotation of the first rotational axis, the second rotational axis, and the third rotational axis.

3. The charged particle beam apparatus of claim 2, wherein the center of rotation changes its position on a predetermined closed curve in three dimensions according to the rotation around at least one among the first rotational axis, the second rotational axis, and the third rotational axis.

4. The charged particle beam apparatus of claim 3, wherein the closed curve is an ellipse.

5. The charged particle beam apparatus of claim 1, further comprising:
    a storage storing table data that shows a corresponding relationship between the correction value and an angle of rotation around each of the first rotational axis, the second rotational axis, and the third rotational axis,
    wherein the processing device acquires the correction value from the table data.

6. The charged particle beam apparatus of claim 1, wherein in addition to correction of the irradiation position for rotation around at least one among the first rotational axis, the second rotational axis, and the third rotational axis, the processing device corrects a geometric positional deviation of the sample with respect to an irradiation reference position set relative to the securing member.

7. The charged particle beam apparatus of claim 1, wherein when the rotation around at least one among the first rotational axis, the second rotational axis, and the third rotational axis is performed during irradiation of the sample with the charged particle beam, the processing device corrects the irradiation position after the rotation is performed.

8. The charged particle beam apparatus of claim 1, wherein in addition to the translation and the rotation around the third rotational axis, the stage is configured to be tiltable together with the sample holder, around a tilt axis in an eucentric manner so that a position of the center of rotation is not changed.

* * * * *